United States Patent [19]

Takahashi

[11] Patent Number: 5,153,429
[45] Date of Patent: Oct. 6, 1992

[54] SOLAR RADIATION SENSOR HOUSING WITH SLANTED PHOTODETECTOR AND KNURLED FILTER

[75] Inventor: Tadahiro Takahashi, Konan, Japan

[73] Assignee: Zexel Corporation, Tokyo, Japan

[21] Appl. No.: 738,906

[22] Filed: Aug. 1, 1991

[30] Foreign Application Priority Data

Aug. 7, 1990 [JP] Japan .................................. 2-208536

[51] Int. Cl.⁵ .............................................. H01J 5/02
[52] U.S. Cl. .................................. 250/239; 250/216; 359/599
[58] Field of Search ............... 250/216, 239; 359/599, 359/566, 569, 571, 574

[56] References Cited

U.S. PATENT DOCUMENTS

| | | | |
|---|---|---|---|
| 2,978,591 | 4/1961 | Ringger | 250/239 |
| 3,274,392 | 9/1966 | Harling | 250/239 |
| 3,671,101 | 6/1972 | Finch | 359/599 |

Primary Examiner—David C. Nelms
Attorney, Agent, or Firm—Wenderoth, Lind & Ponack

[57] ABSTRACT

A solar radiation sensor of the type including a case, a filter provided on an upper surface of the case, and a photodetector disposed in the case for detecting the quantity of solar radiation coming through the filter, wherein the filter has a knurled inside surface for irregularly reflecting incident light, and the photodetector has a light-receiving surface extending obliquely at a predetermined angle of inclination whereby a proper sensitivity to oblique incident light can be maintained even when the sensor is mounted on a flat surface.

7 Claims, 4 Drawing Sheets

FRONT ← RELATIVE RESPONSE → REAR

LEFT ← RELATIVE RESPONSE → RIGHT

SOLAR RADIATION SENSOR HOUSING WITH SLANTED PHOTODETECTOR AND KNURLED FILTER

BACKGROUND OF THE INVENTION

1. Field of the Invention

The present invention relates to a solar radiation sensor for being mounted on a motor vehicle for detecting the quantity of solar radiation incident upon the passenger compartment of the motor vehicle.

2. Description of the Prior Art

One example of solar radiation sensor of the type concerned is disclosed in Japanese Patent Laid-open Publication No. 58-19484, which includes a case, a filter fixed to an upper surface of the case, and a photodetector for detecting the quantity of solar radiation coming through the filter.

Since a light-receiving surface (sensing surface) of the photodetector is so arranged to face vertically upwards when the solar radiation sensor is set on a flat surface, the photodetector is hardly possible to catch or sense the solar radiation when the altitude of the sun is low. Consequently, a desired directivity is difficult to obtain when the solar radiation comes from a particular direction at a large incident angle.

In addition, the filter has a flat surface and hence the light-collecting efficiency of this filter is low.

SUMMARY OF THE INVENTION

With the foregoing difficulties of the prior art in view, it is an object of the present invention to provide a solar radiation sensor which has a high light-receiving efficiency, light-collecting efficiency and light-transmission efficiency and, hence, possesses an excellent sensitivity to an oblique beam of incident light even when the sensor is mounted on a flat surface of the instrument panel of a motor vehicle.

According to the present invention, there is provided a solar radiation sensor mounted on an upper surface of the instrument panel of a motor vehicle for detecting the quantity of solar radiation incident upon the sensor through a window of the motor vehicle, the solar radiation sensor comprising: a base having an oblique portion sloping at a predetermined angle with respect to a horizontal plane, and a lead attachment portion extending downwardly from the oblique portion; a case covering the oblique portion and attached to the base via an attachment means; a filter provided on an upper surface of the case and having a knurled inside surface for irregularly reflecting incident light; and a photodetector disposed on the oblique portion of the base.

When the solar radiation sensor of the foregoing construction is mounted on the flat surface of the instrument panel, a light-receiving surface (sensing surface) of the obliquely disposed photodetector is able to readily catch or sense light of the sun which is incident upon photodetector obliquely to the flat surface of the instrument panel. During that time, the knurled inside surface of the filter reflects the incident light irregularly so that the solar radiation is collected or gathered intensively and efficiently and a proper sensitivity of the photodetector can, therefore, be maintained.

The above and other objects, features and advantages of the present invention will become manifest to those versed in the art upon making reference to the detailed description and the accompanying sheets of drawings in which preferred structural embodiments incorporating the principles of the present invention are shown by way of illustrative example.

DETAILED DESCRIPTION

The present invention will be described hereinbelow in greater detail with reference to certain preferred embodiments shown in the accompanying drawings.

Figure 1:
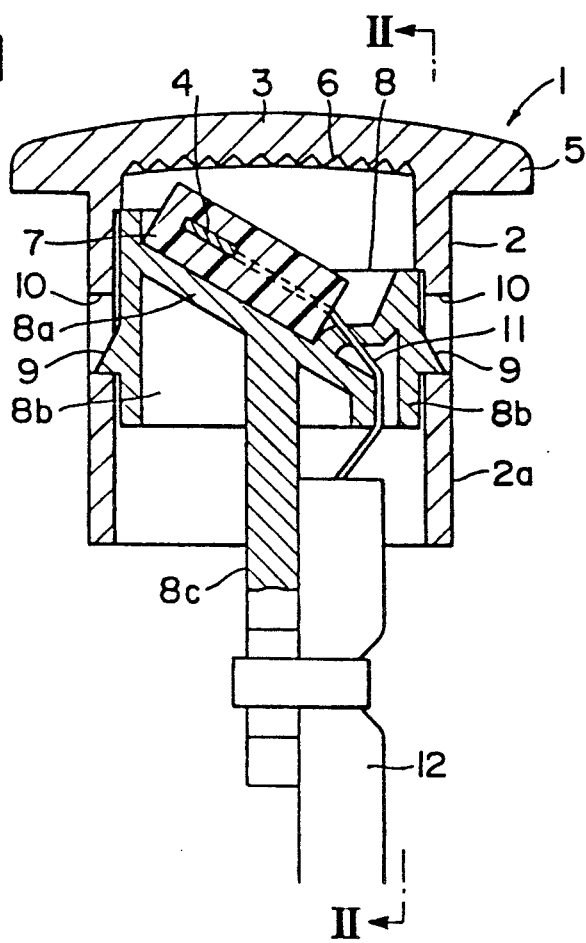
FIG. 1 is a cross-sectional view of a solar radiation sensor according to an embodiment of the present invention.
Figure 2:
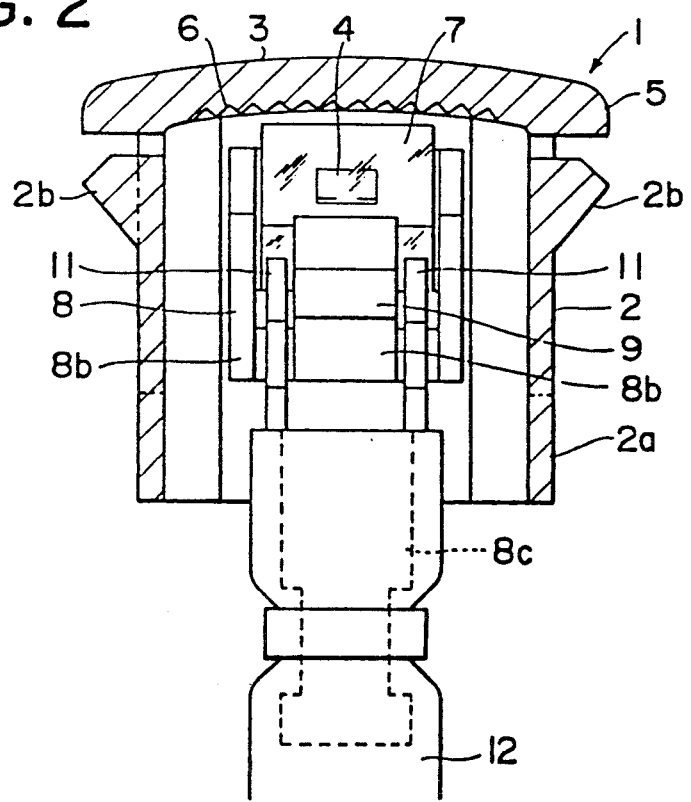
FIG. 2 is a cross-sectional view taken along line II—II of FIG. 1.

As shown in FIGS. 1 and 2, a solar radiation sensor 1 embodying the present invention is adapted to be mounted on an upper surface of the instrument panel of a motor vehicle, for example, for detecting the quantity of solar radiation projected through a windowpane or windshield of the motor vehicle. The solar radiation sensor 1 includes a case 2, a filter 3 provided on an upper end of the case 2, and a photodetector 4 received in the case 2 for detecting the quantity of solar radiation incident thereto through the filter 3.

In the illustrated embodiment, the case 2 and the filter 3 are formed integrally. The case 2 has an annular flange 5 projecting radially outwardly from the upper end thereof where the filter 3 is disposed. The flange 5 is adapted to lies over a mounting portion extending around a hole formed in the instrument panel for receiving a body of the sensor 1. The case 2 has a plurality of radial projections 2b formed on the outside surface of a peripheral wall 2a. The radial projections 2b are engageable with the mounting portion of the instrument panel to attach the sensor 1 to the instrument panel.

Figure 3:
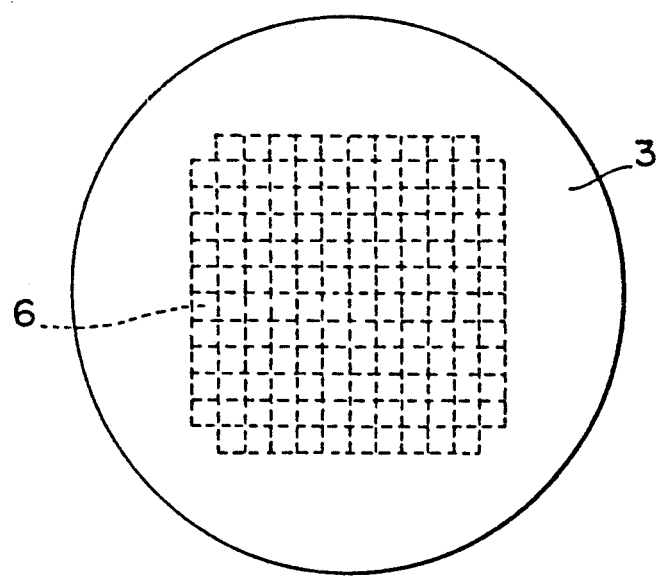
FIG. 3 is a plan view of a filter disposed on the upper surface of a case.
Figure 4:
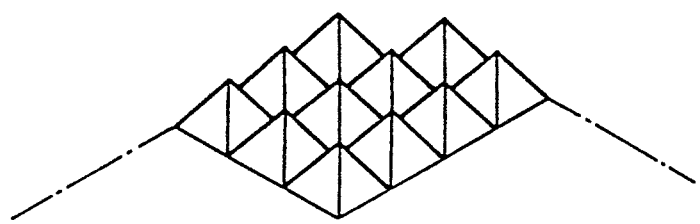
FIG. 4 is a fragmentary perspective view of a mold used for forming the filter.

The filter 3 is an optical element that partly absorbs incident electromagnetic radiation in the visible spectra. The filter 3 has a dome-like upper surface gently curved downwards in a radial outward direction. The inside surface of the filter 3 is flat so that the thickness of the filter 3 gradually reduces from the center toward the peripheral edge. With this varying thickness, the filter 3 has a greater transmittance than a conventional filter having a uniform thickness, with respect to oblique incident light. The inside surface of the filter 3 is knurled as at 6. The knurled inside surface 6 of the filter 3 includes a multiplicity of small projections arranged in rows and columns, as shown in FIG. 3. To form the projections, a knurling mold member such as shown in FIG. 4 is used. The knurling mold member has a number of quadrilateral pyramidal projections and is forced against the inside surface of the filter 3 when the case 2 and the filter 3 are integrally molded.

The filter 3 is integrally molded with the case 2 as described above, however, it may be formed separately from a case and is then assembled with the case.

The photodetector 4 has a film-like structure contained in a protective transparent inert resin coat 7 and is mounted on an upper end of a base 8 secured to the case 2.

The base 8 includes an oblique portion 8a on which the photodetector 4 is mounted, a peripheral wall 8b extending around the oblique portion 8a, and a lead attachment portion 8c integral with and extending downwardly from the oblique portion 8a. The peripheral wall 8b has a plurality of wedge-like locking projections 9 lockingly engageable with corresponding ones of a plurality of retaining recesses or openings 10 formed in the peripheral wall 2a of the case 2. When the base 8 is forced into the case 2, the locking projections 9 are snap-fit with the retaining recesses 10, thereby coupling the base 8 and the case 2 together. The oblique portion 8a of the base 8 is inclined at an angle of 30 degrees relative to a horizontal plane, so that a light-receiving surface (sensing surface) of the photodetector 4 tilts down at about an angle of 30° toward the front side of the motor vehicle.

An output signal from the photodetector 4 is picked up successively through a lead frame 11 connected at one end to the photodetector 4 and through a lead wire 12 connected to the opposite end of the lead frame 11. The lead wire 12 is secured to the lead attachment portion 8c of the base 8.

With the solar radiation sensor 1 of the foregoing construction, since the photodetector 4 is arranged to face the front side of the motor vehicle, the light-sensing surface is able to readily catch or receive incident light of the sun coming through the filter 3 regardless of whether the altitude of the sun is high or low. Due to the oblique or tilted posture, one end (lower end) of the photodetector 4 is spaced from the filter 3 more distantly than the opposite end (upper end), however, the sensitivity of the photodetector is not deteriorated any more because light transmitted through the filter 3 is scattered onto the light-receiving surface of the photodetector 4 by means of the small projections on the knurled inside surface 6 of the filter 3.

A measurement was made to compare the sensitivity of a conventional solar radiation sensor devoid of a knurled surface and having a horizontally arranged photodetector, and the sensitivity of the solar radiation sensor of this invention, with the results shown in FIGS. 5(a) and 5(b) and FIGS. 6(a) and 6(b). As evidenced from FIGS. 5(a) and 5(b), the conventional solar radiation sensor has a good directivity in the vertical direction (i.e., the sensitivity is high when the sun light comes from the vertical upward direction), however, the sensitivity is considerably low when the altitude of the sun is low. Conversely, the solar radiation sensor of this invention shows a good directivity in both the longitudinal direction and the lateral direction of the motor vehicle even if the filter 3 is arranged in a horizontal position.

Figure 5A:
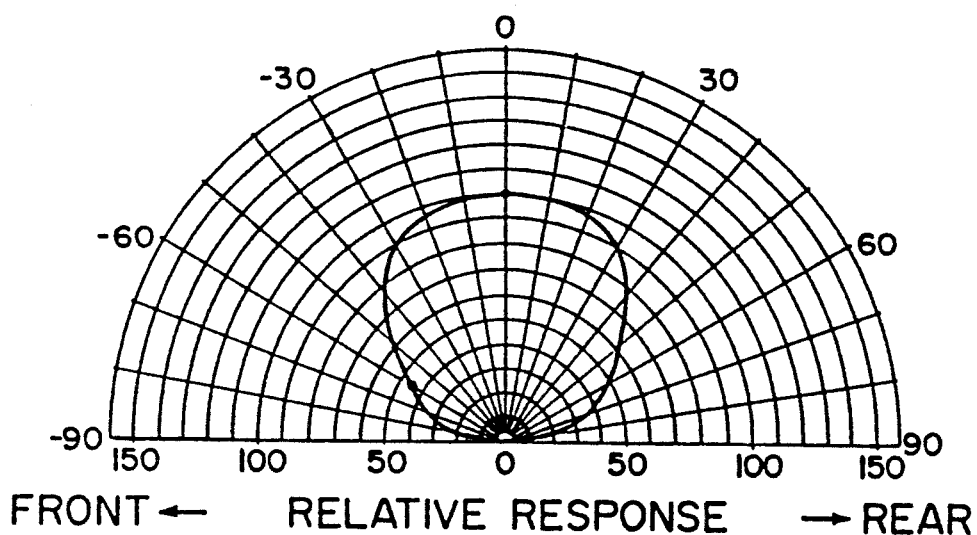
FIGS. 5(a) and 5(b) are graphs showing directivity patterns of a conventional solar radiation sensor in which the directivity pattern shown in FIG. 5(a) is observed when the altitude of a light source is shifted in a direction parallel to the direction of movement of a motor vehicle, while the directivity pattern shown in FIG. 5(b) is observed when the altitude of the light source is shifted in a direction transverse to the direction of movement of the motor vehicle.
Figure 5B:
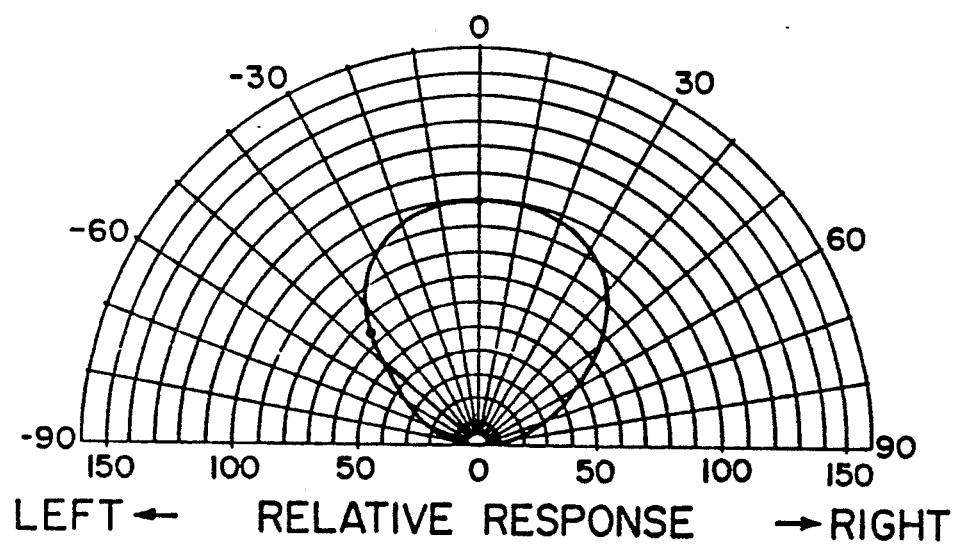
Figure 6A:
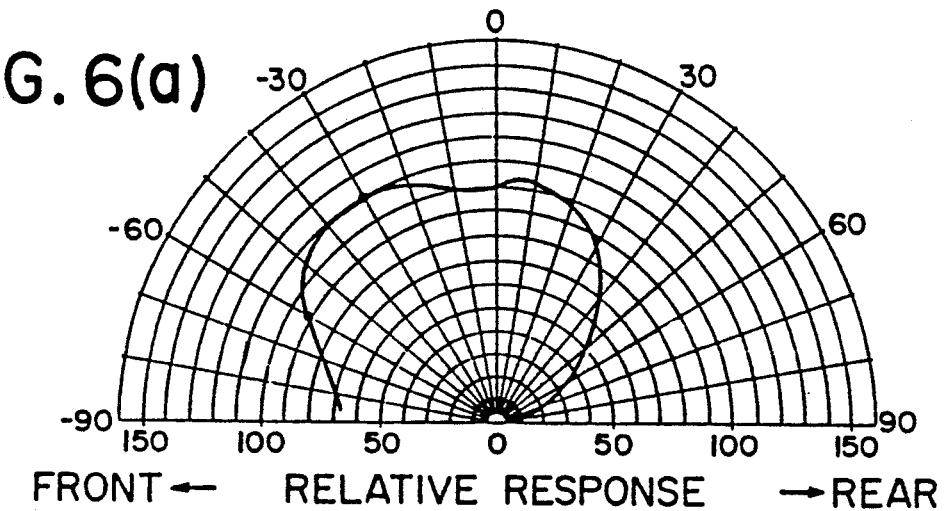
FIGS. 6(a) and 6(b) are graphs similar to FIGS. 5(a) and 5(b), respectively, but showing the directivity patterns of the solar radiation sensor of this invention.

In FIGS. 5(a) and 6(a), an angle of incident light of the sun coming from the vertical upward direction is indicated by 0 (zero), and an incident angle of the sun light inclined from the vertical toward the front side of the vehicle body is indicated by (−), while an incident angle of the sun light inclined from the vertical toward the rear side of the vehicle body is indicated by (+). Similarly, in FIGS. 5(b) and 6(b), an angle of incident light of the sun coming from the vertical upward direction is indicated by 0, an incident angle of the sun light inclined from the vertical toward the left side of the vehicle body is indicated by (−), while an incident angle of the sun light inclined from the vertical toward the right side of the vehicle body is indicated by (+).

In the longitudinal directivity patterns of the conventional and inventive sensors shown in FIGS. 5(a) and 6(a), respectively, the output from each sensor obtained when the incident angle of the sun light is 0° (the altitude of the sun is 90°) is indicated by a value 100(%). When the incident angle of the sun light is −60° (the altitude of the sun is 30° inclined from the vertical toward the front side), the output of the conventional sensor is 46% (46/100) of the maximum output, while the output of the inventive sensor is 83% (92/111) of the maximum output. In the inventive sensor, the maximum output is obtained when the incident angle of the sun light is −30° (the altitude of the sun is 60° inclined from the vertical toward the front side). Thus, the solar radiation sensor of this invention shows an excellent directivity against the sun light coming from the front side of the vehicle body at any angle to the vertical plane.

Figure 6B:
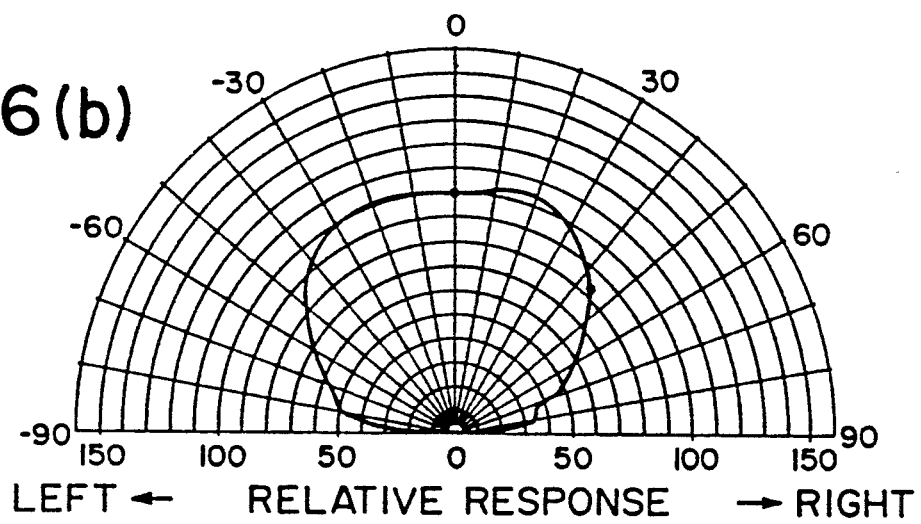

With respect to the lateral directivity patterns shown in FIGS. 5(b) and 6(b), the output from each sensor has a value 100(%) when the incident angle of the sun light is 0° (the altitude of the sun is 90°). When the incident angle of the sun light is 45° (the altitude of the sun is 45° inclined from the vertical toward the left side or the right side), the output of the conventional sensor is 65% (65/100) of the maximum output, while the output of the inventive sensor is 84% (84/100) of the maximum output. The solar radiation sensor of this invention is, therefore, superior in lateral directivity to the conventional solar radiation sensor.

Although the light-receiving surface of the photodetector is inclined at 30° from the vertical toward the front side as shown in the illustrated embodiment, the angle of inclination of the photodetector and the direction of inclination of the photodetector can be changed optionally as occasion arises.

Figure 7:
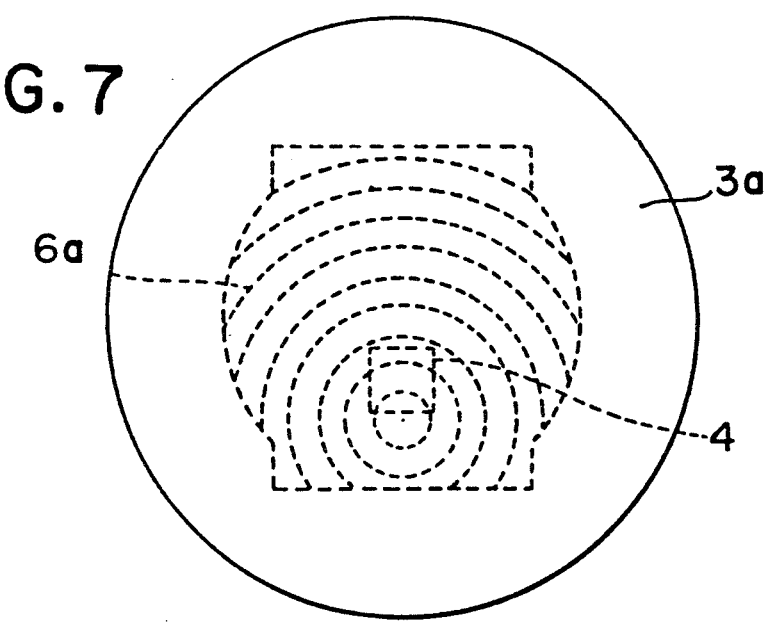
FIG. 7 is a plan view of a filter according to another embodiment.

FIG. 7 shows a filter 3a according to another embodiment. The filter 3a has a knurled inside surface 6a having a number of circular rows of small projections arranged concentrically about a center which is disposed substantially in confrontation to the photodetector 4. With these concentrically arranged projections on the knurled inside surface, the sun light incident upon the filter 3a in any direction can be scattered properly.

As described above, the solar radiation sensor according to the present invention includes a photodetector whose light-receiving surface (sensing surface) is inclined to receive or sense oblique incident light of the sun intensely and efficiently. The light collecting efficiency is further increased by a knurled inside surface of a filter which reflects the incident sun light irregularly. The solar radiation sensor thus constructed is highly sensitive to the sun light coming from a particular direction other than the vertical upward direction and hence has an excellent directivity in the particular direction.

Obviously, various modifications and variations of the present invention are possible in the light of the above teaching. It is therefore to be understood that within the scope of the appended claims the present invention may be practiced otherwise than as specifically described.

What is claimed is:

1. A solar radiation sensor mounted on an upper surface of the instrument panel of a motor vehicle for detecting the quantity of solar radiation incident upon the sensor through a window of the motor vehicle, said solar radiation sensor comprising:
   (a) a base having an oblique portion sloping at a predetermined angle with respect to a horizontal plane, and a lead attachment portion extending downwardly from said oblique portion;
   (b) a case covering said oblique portion and attached to said base via an attachment means;
   (c) a filter provided on an upper surface of said case and having a knurled inside surface for irregularly reflecting incident light; and
   (d) a photodetector disposed on said oblique portion of said base.

2. A solar radiation sensor according to claim 1 wherein said attachment means comprises at least one locking projection provided on a peripheral wall of said base and a retaining recess formed in said case and lockingly engageable with said locking projection to join said base and said case.

3. A solar radiation sensor according to claim 1 wherein said case has a mounting flange for being attached to the instrument panel of the motor vehicle.

4. A solar radiation sensor according to claim 1 wherein said filter has an upper surface gradually curved downwards in a radial outward direction.

5. A solar radiation sensor according to claim 1 wherein said knurled inside surface includes a multiplicity of quadrilateral pyramidal projections arranged in rows and columns.

6. A solar radiation sensor according to claim 1 wherein sand knurled inside surface having a number of circular rows of projections arranged concentrically about a center, said center being disposed substantially in confrontation to said photodetector.

7. A solar radiation sensor according to claim 1 wherein said photodetector disposed on said oblique portion is inclined at an angle of 30 degrees from a horizontal position toward the front side of the motor vehicle.

* * * * *